United States Patent [19]

Radaelli

[11] 4,382,250

[45] May 3, 1983

[54] NONLINEAR DIGITAL TRANSDUCER BASED ON THE GRAY'S ENCODING

[75] Inventor: Dario Radaelli, Legnano, Italy

[73] Assignee: Alfa Romeo S.p.A., Milan, Italy

[21] Appl. No.: 265,225

[22] Filed: May 19, 1981

[30] Foreign Application Priority Data

Jun. 3, 1980 [IT] Italy .............................. 22524 A/80

[51] Int. Cl.³ .......................................... H03K 13/18
[52] U.S. Cl. ............................ 340/347 P; 123/337; 261/1; 261/62; 250/231 SE; 340/347 M
[58] Field of Search ...................... 340/347 M, 347 P; 250/231 SE, 237 G; 123/337; 261/1, 62

[56] References Cited

U.S. PATENT DOCUMENTS 3,358,279 12/1967 Chope ............................ 340/347 P
4,116,000 9/1978 Martin et al. ................... 340/380 X

*Primary Examiner*—T. J. Sloyan
*Attorney, Agent, or Firm*—Charles E. Brown

[57] ABSTRACT

For electronically detecting the displacements of a movable member, such as the throttle of an internal combustion engine an encoding card adapted to the Gray's encoding method is matched with said movable member and an array of phototransistors and photodiodes reads the opaque and the transparent windows formed through the movable member as they pass before the photodiodes so that voltage signals are generated which represent the digit 1 when a transparent window is read out and the digit 0 when an opaque window is read out, the arrangement and the sizes of the windows are in accordance with the Gray's rules of encoding.

5 Claims, 2 Drawing Figures

NONLINEAR DIGITAL TRANSDUCER BASED ON THE GRAY'S ENCODING

This invention relates to a digital transducer for detecting the position of a movable member, capable of supplying a digital electric signal corresponding to the detected magnitude, by exploiting a system for encoding the same magnitude according to the so-called Gray's encoding method.

The transducers based on the Gray's encoding method are generally composed of an encoding card mechanically connected to the movable member, equipped with a grid of elementary opaque and transparent windows corresponding to the binary digits 0 and 1. The windows aforesaid follow an arrangement of the matrix type with sequences of elementary opaque and transparent windows arranged in the direction of the displacement of the movable member and with sequences of elementary opaque and transparent windows arranged perpendicularly to the direction of the displacement of the movable member, wherein the elementary windows of the first sequences aforesaid define the encoded values corresponding to the different positions of the movable member, whereas the elementary windows of the second sequences aforesaid represent the binary digits of the encoded value corresponding to a determined position of the movable member.

The encoding card is moved, dragged by the movable member, relative to a series of phototransistors for detection, the number of which equals that of the sequence of elementary windows arranged perpendicularly to the displacement, that is, equal to the number of binary digits which compose each of the encoded values; the card thus permits the passage of the luminous radiation emitted by a corresponding series of photodiodes towards the phototransistors which confront the transparent windows of a sequence arranged perpendicularly to the displacement, while it intercepts the flow of the same luminous radiation towards the phototransistors which confront the opaque windows of the same sequence arranged perpendicularly to the displacement.

Generally, the voltage signal delivered by each phototransistor is squared up to a comparator circuit for comparison with a preselected voltage threshold, so that the detected value expressed in Gray's code might then be exploited in subsequent processors.

As is well known, the advantage of Gray's encoding over the binary encoding lies in that each of the encoded value differs from the immediately adjoining values by a single digit among those which make up the number, which makes it simple to provide a displacement transducer which works both accurately and reliably.

In the known applications of the transducers based on Gray's encoding, the gap between the encoded values and the difference between the positions which can be detected, have the same values throughout the entire field of variation of the linear or angular displacement of the movable member and, in fact, the width of the elementary opaque and transparent windows, which is equal to that gap, has a constant value in the direction of the displacement of the movable member in question.

It has been ascertained, however, that transducers of the kind referred to above are inadequate in those cases in which it is required to detect a physical magnitude, such as the displacements of a movable member, with different degrees of resolving power according to the value taken by the magnitude concerned in its field of variation. This is particularly true whenever the detected magnitude is exploited as a regulation parameter and exhibits in the regulation process a sensitivity which is varied as a function of its absolute value.

An example of such a situation is that of the regulation apparatus in internal combustion engines wherein the engine working parameters, such as the angular shifts of a butterfly valve or of intake-throttling valves, butterfly valve for measuring the volumes of air drawn in by the engine, for measuring the intake pressure, the rpm and like magnitudes are exploited as regulation parameters for controlling the functional features of the engine concerned, such as the fuel feed, the ignition angle of advance and the like.

In these regulation processes it is often required that the accuracy of intervention under conditions of engine operation when the rpm is low and the angle of aperture of the throttling butterfly(ies) is narrow, so that it becomes necessary that the deviations between the detected values of the engine parameters be minimized as far as practicable and that a high concentration of the detected values is obtained.

Conversely, under engine operation conditions characterized by high rpm's and wide angles of aperture of the throttling butterfly(ies), the deviations between the detected engine parameters can be comparatively wide and a comparatively low concentration of detected values can be accepted.

The transducers must thus be capable of delivering the detected values with the desired degree of resolution power under the different working conditions of the engine. To solve such a problem, the encoding card equipped with elementary windows having a constant width can operatively be connected to the movable member by a drive-transfer mechanism having a variable transmission ratio so that the displacements of the card itself are enlarged relative to those of the movable member in the areas of interest. However, a transducer of this kind cannot be completely accurate in its response because the more intricate the drive-transfer mechanism interposed between the movable member and the encoding card is, the greater are the clearances and the frictional forces which erratically modify the response itself.

An object of the present invention is to provide a digital transducer based on the Gray's encoding method, which is capable of delivering the values of the displacement detected with a different degree of resolution power as a function of the value of the displacement concerned, even irrespective of the use of a drive-transfer mechanism having a variable transmission ratio.

Having this object in view, the transducer according to the present invention is composed by an encoding card mechanically connected with the movable member the displacements of which are to be detected, the encoding card being equipped with a grid of opaque and transparent windows, with sequences of elementary windows arranged perpendicularly to the direction of the displacement, said sequences having a number equalling that of the encoded values corresponding to the different positions of the movable member, and with sequences of elementary windows arranged along the direction of the displacement, said sequences having a number equalling that of the binary digits which make up the same encoded values, said transducer being also composed by a series of photodiodes and a series of phototransistors the number of which is equal to that of the elementary windows which represent the binary digits of each of the encoded values, said photodiodes and said phototransistors being in fixed positions relative to the encoding card and being arranged confrontingly with the encoding card interposed therebetween, and a collimating member capable of directing a luminous radiation from the photodiodes onto the phototransistors, the transducer also comprising a comparison circuit operatively connected to said phototransistors, the comparators being capable of squaring up the voltage signal delivered by every phototransistor for comparison with a preselected voltage threshold, said transducer being characterized by an encoding card in which the gap between the encoded displacement values is variable as a function of the same values as taken by the displacement in the variation field thereof, and the width of the opaque and transparent elementary windows, as measured in the direction of the displacement, is variable, since it is equal to the width of the gap.

According to a preferred embodiment, the overall width of each window, opaque or transparent, of each sequence arranged along the direction of the displacement, said overall width being measured along the direction of the displacement, is equal to a preselected power of the number two by the aforesaid variable gap, the powers of the number two associated with the different sequences arranged in the direction of the displacement being variable according to a geometric series.

Features and advantages of the invention will become more clearly apparent from the scrutiny of the accompanying FIGS. 1 and 2 of the drawings, wherein a preferred embodiment of the invention is shown by way of a nonlimiting example.

Figure 1:
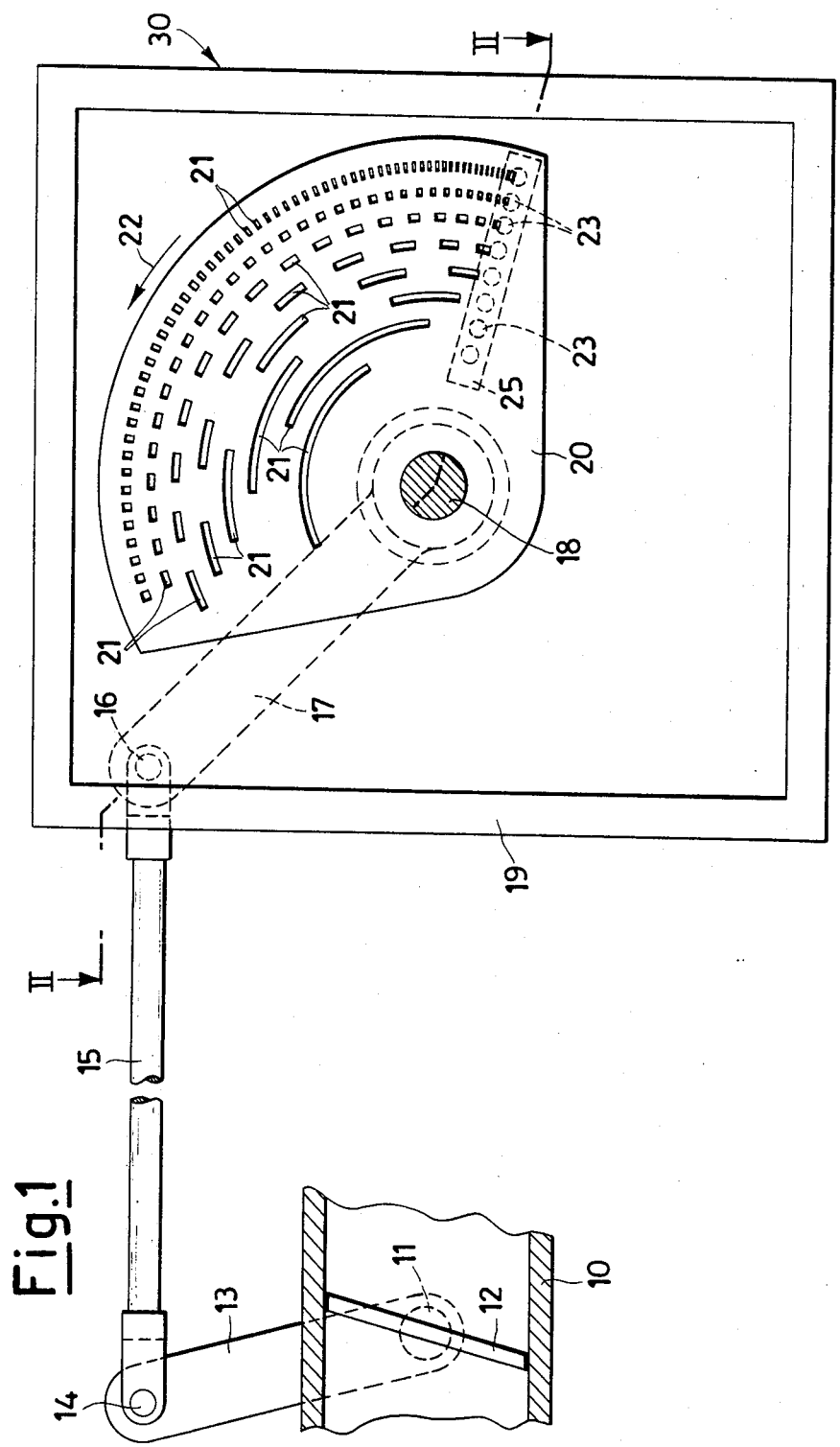
FIG. 1 shows a transducer made according to the invention, as used for detecting the angular shifts of a throttling butterfly(ies) of an internal combustion engine, the transducer being viewed in cross-sectional view taken along the line I—I of FIG. 2.

In FIG. 1 there is shown a section of a trunk of an intake duct 10 of an internal combustion engine in which is supported for rotation about an arbor 11 a throttling butterfly 12, which enables the car driver, through the linkage connected to the accelerator pedal (not shown), to meter the rate of flow of mixture drawn in by the engine, if the engine is of the carburettor type, or to meter the rate of flow of air, if the engine is of the injection type.

The arbor 11 of the throttling butterfly 12, shown herein in its position of maximum closure, is integral with a lever, indicated at 13, pivoted at 14 to a rod 15, which, in its turn, is pivotally connected at 16 to a lever 17 integral with an arbor 18 supported for rotation in a box 19: to the shaft 18 is keyed a circular sector 20 which is the encoding card of the transducer of the angular shifts of the throttle 12 and is generally indicated at 30.

Figure 2:
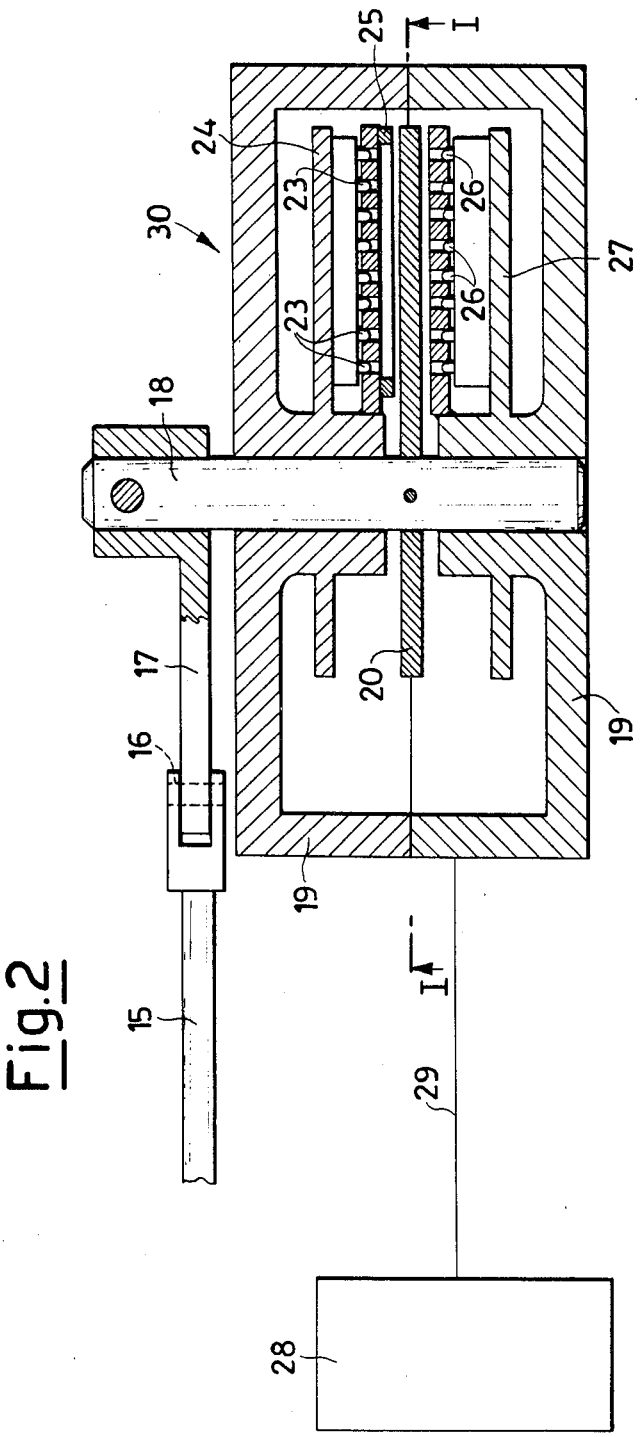
FIG. 2 shows the same transducer in cross-sectional view, taken along the line II—II of FIG. 1.

In this particular case, the encoding card 20 has the shape of a circular sector since it is used for detecting angular displacements of the throttle 12, and the sequences of opaque and transparent windows, arranged in the direction of the same angular shifts, lie along concentrical circumferences coaxial with the axis of rotation of the card 20 (arbor 18). In the example shown herein, on the card 20 there are imprinted eight circumferential sequences of opaque and transparent windows (each sequence is indicated at 21), because every one of the values of the angular shift which is encoded is represented by eight binary digits: the values of angular shift which have been encoded are, in fact, identified by the radial sequences of elementary opaque and transparent windows, the width of which, as measured along the direction of the displacement, is equal to the gap which has been preselected between the encoded angular shift values. As outlined above, the gap is variable in the direction of the displacement and, in the case in point, is increased in the direction of the arrow 22 of FIG. 1, so that, since the width of each elementary window equal to the gap, the overall width of the opaque and transparent windows belonging to every circumferential sequence 21, is increased proportionally with the gap in the direction of the arrow 22 aforesaid: moreover, in the transition from a circumferential sequence to another, the overall width of the opaque and transparent windows is varied in a geometric proportion with the gap: the width of the windows belonging to the first sequence, i.e. the outermost one, is equal to the first power of the number two by the gap; the width of the window belonging to the second sequence is equal to the second power of the number two by the gap and so forth up to the eight sequence for which the overall width of the windows is equal to the eight power of the number two by the gap. In FIG. 2 there can be seen the other component parts of the transducer 30: a series of photodiodes indicated at 23, supported by the plate 24, their number be equal to the number of circumferential sequences of opaque and transparent windows in the encoding card, this number being eight in the example shown; a collimating member indicated at 25, which has the task of directing the light radiation from the photodiodes onto the phototransistors and can be equipped either with a single longitudinal slit having an appropriate length and width, or with a set of longitudinal slits the number of which is equal to that of the photodiodes; a set of phototransistors, indicated at 26 and supported by the plate 27, their number being equal to that of the photodiodes. The photodiodes, the collimating member and the phototransistors are in fixed position relative to the encoding card and are located parallel of the radial sequence of elementary opaque and transparent windows which defines the position of maximum closure of the throttle 12.

In FIG. 2 there is shown with a block 28 the circuitry of the comparators connected at 29 with the set of the phototransistors; the circuitry carries out the squaring up of the voltage signal delivered by each phototransistor by comparison with a preselected voltage threshold so as to render the detected value of the displacement, expressed in the Gray's code, usable by the subsequent processors.

Every angular position taken by the throttling butterfly 12 corresponds to an angular position of the encoding card 20 which is moved on a plane perpendicular to the plane which contains the photodiodes and the phototransistors; these, via the collimating member 25, are confrontingly arranged relative to the elementary opaque and transparent windows of the different radial sequences: the light radiation delivered by the photodiodes impinges on the phototransistors which confront the transparent elementary windows of a radial sequence, whereas light is intercepted by the opaque elementary windows of the same radial sequence: the former transistors are energized and made conductive and deliver a voltage signal which represents the digit 1, the latter transistors remain in-active and the absence of signals represents the digit 0. The assembly of the eight digits, a combination of 1's and 0's is the detected value of the angular position of the throttle 12, expressed in the Gray's code.

Inasmuch as the gap between the encoded values (opaque and transparent windows 21) is increased as the aperture of the throttle 12 is increased, there is a large number of encoded values in correspondence with the small apertures of the throttle, whereas the encoded values are less numerous in correspondence with the wide apertures of the throttle and for this reason the transducer correspondingly displays a keener or a coarser degree of definition.

Obviously, the criterion of evaluation of the gap between the encoded values can differ from that described herein: the choice will exclusively be dictated by the kind of use the transducer is intended for.

In the example shown, the drive-transfer linkage (13, 14, 15, 16, 17) from the throttle 12 to the encoding card 20 has a variable transmission ratio and it permits an amplification of the angular displacements of the encoding card relative to the shifts of the throttle in correspondence with narrow angles of aperture of the throttle itself.

This expedient, embodied by a very simple drive-transfer linkage, improves the degree of resolution of the transducer without, however, jeopardizing the accuracy of the response, but the encoding card can directly be keyed to the arbor 11 of the throttling butterfly when the degree of resolution which can be obtained via the variable gap of the encoded values is just the expected one.

I claim:

1. An analogic-digital transducer based on the Gray's encoding method for detecting the position of a movable member, comprising an encoding card mechanically connected to said movable member, the encoding card being equipped with a grid of opaque and transparent windows with sequences of elementary windows arranged perpendicularly to the direction of the displacement, said sequences being in a number equal to that of the encoded values corresponding to the different positions of the movable member, and with sequences of elementary windows arranged in the direction of the displacement, said sequences being in a number equalling that of the binary digits which compose the same encoded values, said transducer comprising a series of photodiodes and a series of phototransistors in a number equalling that of the elementary windows which compose the binary digits of each of the encoded values, said photodiodes and said phototransistors being fixed relative to the encoding card and being confrontingly positioned with the encoding card interposed therebetween and with a collimating member capable of concentrating the luminous radiation of the photodiodes onto the phototransistors, the transducer further comprising a circuitry of comparators operatively connected with said phototransistors and capable of squaring up the voltage signal delivered by each phototransistor for comparison with a preselected voltage threshold, said transducer being characterized by an encoding card wherein the gap between the encoded displacement values is variable as a function of the same values taken by the displacement in the field of variation thereof and the width of the elementary opaque and transparent windows, as measured in the direction of the displacement, is variable and is equal to the gap width.

2. A transducer according to claim 1, characterized by an encoding card in which the overall width of each opaque window and of each transparent window of each sequence arranged in the direction of the displacement, said overall width being measured in the direction of the displacement, is equal to a preselected power of the number two by said variable gap, the powers of the number two associated with the several sequences arranged in the direction of the displacement being varied according to a geometric series.

3. A transducer according to claim 1 for detecting the angular positions of a throttle valve of an internal combustion engine, said transducer comprising an encoding card in the form of a circular sector having a grid of opaque and transparent windows with sequences of elementary opaque and transparent windows arranged radially, in a number equal to that of the encoded values of angular displacement and with a sequence of elementary opaque and transparent windows arranged circumferentially, their number being equal to that of the binary digits which compose the same encoded values, said transducer being characterized by an encoding card wherein the gap, measured in the circumferential direction, between the values of angular displacement and encoded is variable as a function of the same values taken by the angular displacement in the field of variation thereof and the width of the elementary opaque and transparent windows measured in the circumferential direction is variable and is equal to the gap width.

4. A transducer according to claim 3, characterized by an encoding card wherein the overall width of each opaque window and of each transparent window of each circumferential sequence, said overall width being measured in the circumferential direction, is equal to a preselected power of the number two by the said variable gap, the powers of the number two associated with the different circumferentially arranged sequences being varied according to a geometric series.

5. A transducer according to claim 1, characterized in that the encoding card is mechanically connected to the movable member by a drive-transfer linkage having a transmission ratio which is variable in the field of variation of the displacements of said movable member.

* * * * *